(12) United States Patent
Bollen

(10) Patent No.: US 11,098,207 B2
(45) Date of Patent: Aug. 24, 2021

(54) METALLIC NANOPARTICLE DISPERSION

(71) Applicant: AGFA-GEVAERT NV, Mortsel (BE)

(72) Inventor: Dirk Bollen, Mortsel (BE)

(73) Assignee: AGFA-GEVAERT NV, Mortsel (BE)

( * ) Notice: Subject to any disclaimer, the term of this patent is extended or adjusted under 35 U.S.C. 154(b) by 141 days.

(21) Appl. No.: 16/327,391

(22) PCT Filed: Aug. 24, 2017

(86) PCT No.: PCT/EP2017/071314
§ 371 (c)(1),
(2) Date: Feb. 22, 2019

(87) PCT Pub. No.: WO2018/037072
PCT Pub. Date: Mar. 1, 2018

(65) Prior Publication Data
US 2019/0185686 A1     Jun. 20, 2019

(30) Foreign Application Priority Data

Aug. 26, 2016 (EP) .................................... 16185807

(51) Int. Cl.
| | | |
|---|---|---|
| *C09D 11/52* | (2014.01) | |
| *C09D 7/20* | (2018.01) | |
| *C09D 7/40* | (2018.01) | |
| *C09D 7/62* | (2018.01) | |
| *C09D 7/65* | (2018.01) | |
| *C08K 3/08* | (2006.01) | |
| *C09D 5/24* | (2006.01) | |
| *H05K 1/09* | (2006.01) | |
| *C09D 7/63* | (2018.01) | |
| *C09D 11/02* | (2014.01) | |
| *C09C 1/30* | (2006.01) | |
| *C09D 11/00* | (2014.01) | |
| *C09D 17/00* | (2006.01) | |
| *H05K 3/12* | (2006.01) | |
| *C08K 5/5435* | (2006.01) | |
| *B82Y 40/00* | (2011.01) | |
| *C08K 5/5419* | (2006.01) | |
| *C08L 27/06* | (2006.01) | |

(52) U.S. Cl.
CPC .................. *C09D 7/20* (2018.01); *C09C 1/30* (2013.01); *C09C 1/3081* (2013.01); *C09D 5/24* (2013.01); *C09D 7/63* (2018.01); *C09D 7/67* (2018.01); *C09D 11/00* (2013.01); *C09D 11/02* (2013.01); *C09D 11/52* (2013.01); *C09D 17/006* (2013.01); *H05K 1/097* (2013.01); *B82Y 40/00* (2013.01); *C08K 5/5419* (2013.01); *C08K 5/5435* (2013.01); *C08L 27/06* (2013.01); *H05K 3/1275* (2013.01); *H05K 3/1283* (2013.01); *H05K 2203/1131* (2013.01)

(58) Field of Classification Search
None
See application file for complete search history.

(56) References Cited

U.S. PATENT DOCUMENTS

| | | | | |
|---|---|---|---|---|
| 7,820,097 | B2* | 10/2010 | Schroder | .............. H05K 3/1283 |
| | | | | 419/45 |
| 8,071,888 | B2* | 12/2011 | Shiraishi | ................ H05K 1/095 |
| | | | | 174/257 |
| 8,534,821 | B2* | 9/2013 | Kawashima | ......... B41M 5/0064 |
| | | | | 347/100 |
| 8,693,079 | B2* | 4/2014 | Agrawal | ................. G02F 1/161 |
| | | | | 359/267 |
| 9,394,320 | B2* | 7/2016 | Chau | ..................... C07F 7/1804 |
| 10,005,294 | B1* | 6/2018 | Kanungo | ............. B41J 11/0015 |
| 2003/0170448 | A1 | 9/2003 | Yukinobu et al. | |

(Continued)

FOREIGN PATENT DOCUMENTS

| CN | 105833834 A | 8/2016 |
|---|---|---|
| EP | 2 671 927 A1 | 12/2013 |

(Continued)

OTHER PUBLICATIONS

English abstract of CN 103740172 A, Dec. 20, 2013, China, 7 pages.*

(Continued)

*Primary Examiner* — Tae H Yoon
(74) *Attorney, Agent, or Firm* — Leydig, Voit & Mayer, Ltd.

(57) ABSTRACT

A metallic nanoparticle dispersion includes metallic nanoparticles, a liquid carrier and an optional binder, and a silane compound according to Formula I:

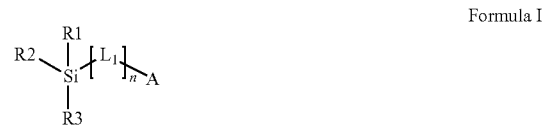

Formula I wherein
R1, R2 and R3 are independently selected from the group consisting of a hydrogen, a substituted or unsubstituted alkyl group, a substituted or unsubstituted aryl group, an alkoxy group and an aryloxy group with the proviso that at least one of R1 to R3 represents an alkoxy group or an aryloxy group,
L1 represents a divalent linking group including one to 20 carbon atoms,
A represents a thiol, a disulfide or a functional moiety comprising at least one thiol or disulfide, having no more than 10 carbon atoms, and
n represents 0 or 1.

15 Claims, No Drawings

(56) References Cited

U.S. PATENT DOCUMENTS

| | | |
|---|---|---|
| 2008/0134936 A1 | 6/2008 | Kamikoriyama et al. |
| 2009/0252924 A1 | 10/2009 | Kamikoriyama et al. |
| 2014/0106176 A1 | 4/2014 | Albert et al. |
| 2017/0236610 A1* | 8/2017 | Wu .................. C09D 11/52 427/535 |

FOREIGN PATENT DOCUMENTS

| | | |
|---|---|---|
| EP | 2 781 562 A1 | 9/2014 |
| WO | 03/041897 A2 | 5/2003 |
| WO | 2015/132719 A1 | 9/2015 |

OTHER PUBLICATIONS

Official Communication issued in International Patent Application No. PCT/EP2017/071314, dated Nov. 3, 2017.

* cited by examiner

METALLIC NANOPARTICLE DISPERSION

CROSS REFERENCE TO RELATED APPLICATIONS

This application is a 371 National Stage Application of PCT/EP2017/071314, filed Aug. 24, 2017. This application claims the benefit of European Application No. 16185807.1, filed Aug. 26, 2016, which is incorporated by reference herein in its entirety.

BACKGROUND OF THE INVENTION

1. Field of the Invention

The present invention relates to metallic nanoparticle dispersions, for example nanosilver dispersions, and to conductive inks and pastes prepared therefrom. The invention also relates to a method of preparing the metallic nanoparticle dispersion and to conductive layers or patterns formed from the metallic nanoparticle dispersion or inks at moderate curing conditions.

2. Description of the Related Art

The interest in metallic printing or coating fluids comprising metallic nanoparticles has increased during the last decades due to their unique properties when compared to the bulk properties of a given metal. For example, the melting point of metallic nanoparticles decreases with decreasing particle size making them of interest for printed electronics, electrochemical, optical, magnetic and biological applications.

The production of stable and concentrated metallic printing or coating fluids, which can be printed, for example by inkjet printing, or coated at high speed is of great interest as it enables the preparation of electronic devices at low costs.

Metallic printing or coating fluids are typically metallic nanoparticle dispersions comprising metallic nanoparticles and a dispersion medium. Such metallic nanoparticle dispersions can be directly used as a printing or coating fluid. However, additional ingredients are often added to the metallic nanoparticle dispersion to optimize the properties of the resulting metallic printing or coating fluids.

The preparation of metallic nanoparticles may be carried out in water or organic solvents by the so-called polyol synthesis as disclosed in for example "*Approaches to the synthesis and Characterization of Spherical and Anisotropic Silver Nanomaterials*", *Metallic Nanomaterials* Vol. 1., Edited by Challa S. S. R. Kumar, Wiley-VCH Verlag GmbH&Co.KGaA, Weinheim, by a derivative of the polyol synthesis methodology or by an in-situ reduction of metallic salts in the presence of various reducing agents. Such methods are disclosed in for example US2010143591, US2009142482, US20060264518, EP-A 2147733, EP-A 2139007, EP-A 803551, EP-A 2012952, EP-A 2030706, EP-A 1683592, EP-A 166617, EP-A 2119747, EP-A 2087490, EP-A 2010314, WO2008/151066, WO2006/076603, WO2009/152388, WO2009/157393.

A polymeric dispersant is often used in the preparation of the metallic nanoparticles to obtain stable metallic printing or coating fluids. The polyol synthesis to prepare silver nanoparticles referred to above is typically carried out in the presence of polyvinylpyrrolidone (PVP). Non-stable metallic nanoparticle dispersions may lead to irreversible phase separation causing among others clogging of coating or print heads. Agglomeration of the metallic nanoparticles may also result in a decrease of the conductivity.

Polymeric dispersants are typically homo- or copolymers prepared from acrylic acid, methacrylic acid, vinyl pyrrolidinone, vinyl butyral, vinyl acetate or vinyl alcohol monomers.

Typically, after applying the metallic printing or coating fluids on a substrate, a sintering step, also referred to as curing step, at elevated temperatures is carried out to induce/enhance the conductivity of the applied patterns of layers. The organic components of the metallic printing or coating fluids, for example the polymeric dispersants, may reduce the sintering efficiency and thus the conductivity of the applied patterns of layers. For this reason, higher sintering temperatures and longer sintering times are often required to decompose the organic components.

Typical polymeric dispersants, such as those described above, are characterized by a full decomposition temperature of at least 350° C. Therefore, the layers or patterns coated or printed with metallic printing or coating fluids comprising such polymeric dispersants typically require a sintering step at elevated temperatures to be sure that most of the polymeric dispersants are decomposed.

Such high sintering temperatures are not compatible with common polymer foils, such as polyethylene terephthalate (PET) or polycarbonate, which have relatively low glass transition temperatures. This restricts the choice to more expensive polymers such as polyimide.

There is thus an interest in lowering the sintering temperatures needed to obtain conductive layers or patterns.

EP-A 2468827 discloses polymeric dispersants having 95 wt % decomposition at a temperature below 300° C., as measured by Thermal Gravimetric Analysis. By using metallic printing or coating fluids comprising such polymeric dispersants, the sintering temperature and time could be reduced. In EP-A 2608218 and EP-A 2608217 a so called sintering additive is used in combination with a polymeric dispersant of EP-A 2468827 to further lower the sintering temperature.

EP-A 2671927 discloses a metallic nanoparticle dispersion comprising a specific dispersion medium, for example 2-pyrrolidone, resulting in a more stable dispersion without using a polymeric dispersant.

EP-A 2781562 discloses a method of preparing metallic nanoparticle dispersions in the presence of a specific dispersion medium, for example 2-pyrrolidone, and a carboxylic acid.

WO2003/041897 discloses a composition comprising silver metal particles and a silane derivative comprising at least one methyl group and at least one alkoxy group.

WO2015/132719 discloses 3-(aminopropyl)trimethoxysilane as a dispersant for cupper nanoparticles.

Screen printing of silver inks involves different steps:
flooding of the screen or mesh, wherein the silver ink is spread across the screen or mesh;
printing, wherein the silver ink is pushed through the screen openings on the substrate, and
levelling of the printed silver ink on the substrate.

Insufficient levelling of the printed silver ink may result in a rough silver pattern, or even in pinholes, i.e. transparent areas between two neighbouring printed silver dots. The occurrence of such pinholes may result in a decreased conductivity.

The viscosity of the silver ink may influence the different screen printing steps mentioned above. Flooding of the screen becomes better when the viscosity of the silver ink is not too high. Also for a sufficient levelling of the ink, the viscosity of the ink may not be too high. On the other hand, a good printing quality requires a sufficiently high viscosity.

SUMMARY OF THE INVENTION

Preferred embodiments of the present invention provide a metallic nanoparticle dispersion wherewith highly conductive and smooth coatings or patterns can be obtained. These advantages and benefits are realized by the metallic nanoparticle dispersion as defined below.

Further advantages and embodiments of the present invention will become apparent from the following description.

DETAILED DESCRIPTION OF THE PREFERRED EMBODIMENTS

Definitions

The terms polymeric support and foil, as used herein, mean a self-supporting polymer-based sheet, which may be associated with one or more adhesion layers, e.g. subbing layers. Supports and foils are usually manufactured through extrusion.

The term layer as used herein, is considered not to be self-supporting and is manufactured by coating or spraying it on a (polymeric) support or foil.

PET is an abbreviation for polyethylene terephthalate.

The term alkyl means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl group or a naphthyl group including one, two, three or more $C_1$ to $C_6$-alkyl groups.

Unless otherwise specified a substituted or unsubstituted alkaryl group is preferably a $C_1$ to $C_6$-alkyl group including an aryl group, preferably a phenyl group or naphthyl group.

Unless otherwise specified a substituted or unsubstituted aryl group is preferably a substituted or unsubstituted phenyl group or naphthyl group.

A cyclic group includes at least one ring structure and may be a monocyclic- or polycyclic group, meaning one or more rings fused together.

A heterocyclic group is a cyclic group that has atoms of at least two different elements as members of its ring(s). The counterparts of heterocyclic groups are homocyclic groups, the ring structures of which are made of carbon only. Unless otherwise specified a substituted or unsubstituted heterocyclic group is preferably a five- or six-membered ring substituted by one, two, three or four heteroatoms, preferably selected from oxygen atoms, nitrogen atoms, sulphur atoms, selenium atoms or combinations thereof.

An alicyclic group is a non-aromatic homocyclic group wherein the ring atoms consist of carbon atoms.

The term heteroaryl group means a monocyclic- or polycyclic aromatic ring comprising carbon atoms and one or more heteroatoms in the ring structure, preferably, 1 to 4 heteroatoms, independently selected from nitrogen, oxygen, selenium and sulphur. Preferred examples of heteroaryl groups include, but are not limited to, pyridinyl, pyridazinyl, pyrimidyl, pyrazyl, triazinyl, pyrrolyl, pyrazolyl, imidazolyl, (1,2,3,)- and (1,2,4)-triazolyl, pyrazinyl, pyrimidinyl, tetrazolyl, furyl, thienyl, isoxazolyl, thiazolyl, isoxazolyl, and oxazolyl. A heteroaryl group can be unsubstituted or substituted with one, two or more suitable substituents. Preferably, a heteroaryl group is a monocyclic ring, wherein the ring comprises 1 to 5 carbon atoms and 1 to 4 heteroatoms.

The term substituted, in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl, a substituted heteroaryl and a substituted heterocyclic group are preferably substituted by one or more substituents selected from the group consisting of methyl, ethyl, n-propyl, isopropyl, n-butyl, 1-isobutyl, 2-isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —$NO_2$.

The Metallic Nanoparticle Dispersion

A metallic nanoparticle dispersion according to the present invention comprises metallic nanoparticles, a liquid carrier and an optional binder, characterized in that the dispersion further comprises a silane compound according to Formula I:

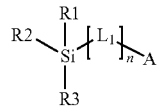

wherein

R1, R2 and R3 are independently selected from the group consisting of a hydrogen, a substituted or unsubstituted alkyl group, a substituted or unsubstituted aryl group, an alkoxy group and an aryloxy group with the proviso that at least one of R1 to R3 represents an alkoxy group or an aryloxy group, $L_1$ represents a divalent linking group comprising 1 to 20 carbon atoms, A represents a thiol, a disulfide or a functional moiety comprising at least one thiol or disulfide, having no more than 10 carbon atoms, and n represents 0 or 1.

The metallic nanoparticle dispersion may further comprise a surfactant and other additives to further optimize its properties.

Silane compound

The metallic nanoparticle dispersion comprises a silane compound according to Formula I:

Formula I

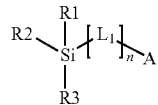

wherein

R1, R2 and R3 are independently selected from the group consisting of a hydrogen, a substituted or unsubstituted alkyl group, a substituted or unsubstituted aryl group, an alkoxy group and an aryloxy group with the proviso that at least one of R1 to R3 represents an alkoxy group or an aryloxy group, $L_1$ represents a divalent linking group comprising 1 to 20 carbon atoms, A represents a thiol, a disulfide or a functional moiety comprising at least one thiol or disulfide, having no more than 10 carbon atoms, and n represents 0 or 1.

In a preferred embodiment, the silane compound is a compound according to Formula II:

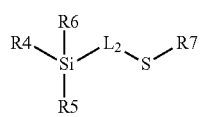

Formula II wherein

R4, R5 and R6 are independently selected from the group consisting of a hydrogen, a substituted or unsubstituted alkyl group, a substituted or unsubstituted aryl group, an alkoxy group and an aryloxy group with the proviso that at least one of R4 to R6 represents an alkoxy group or an aryloxy group, $L_2$ represents an aliphatic divalent linking group comprising 1 to 10 carbon atoms, optionally substituted in the aliphatic chain with one or more oxygen or nitrogen atoms, R7 is hydrogen or S—R8, R8 is selected from the group consisting of a substituted or unsubstituted alkyl group, a substituted or unsubstituted alkenyl group, a substituted or unsubstituted alkynyl group, a substituted or unsubstituted aralkyl group, a substituted or unsubstituted alkaryl group and a substituted or unsubstituted aryl or heteroaryl group.

In a particularly preferred embodiment R7 represents a hydrogen.

In the most preferred embodiment, the silane compound is a compound according to Formula III:

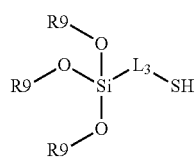

Formula III wherein

R9 represents a substituted or unsubstituted alkyl group, $L_3$ represents an aliphatic linking group comprising 1 to 5 carbon atoms.

In a particularly preferred embodiment, R9 is selected from the group consisting of methyl, ethyl, propyl and butyl.

In a further preferred embodiment, $L_3$ is selected from the group consisting of a methylene group, an ethylene group and a propylene group.

Examples of silane compounds according to the present invention are given in Table 1.

TABLE 1

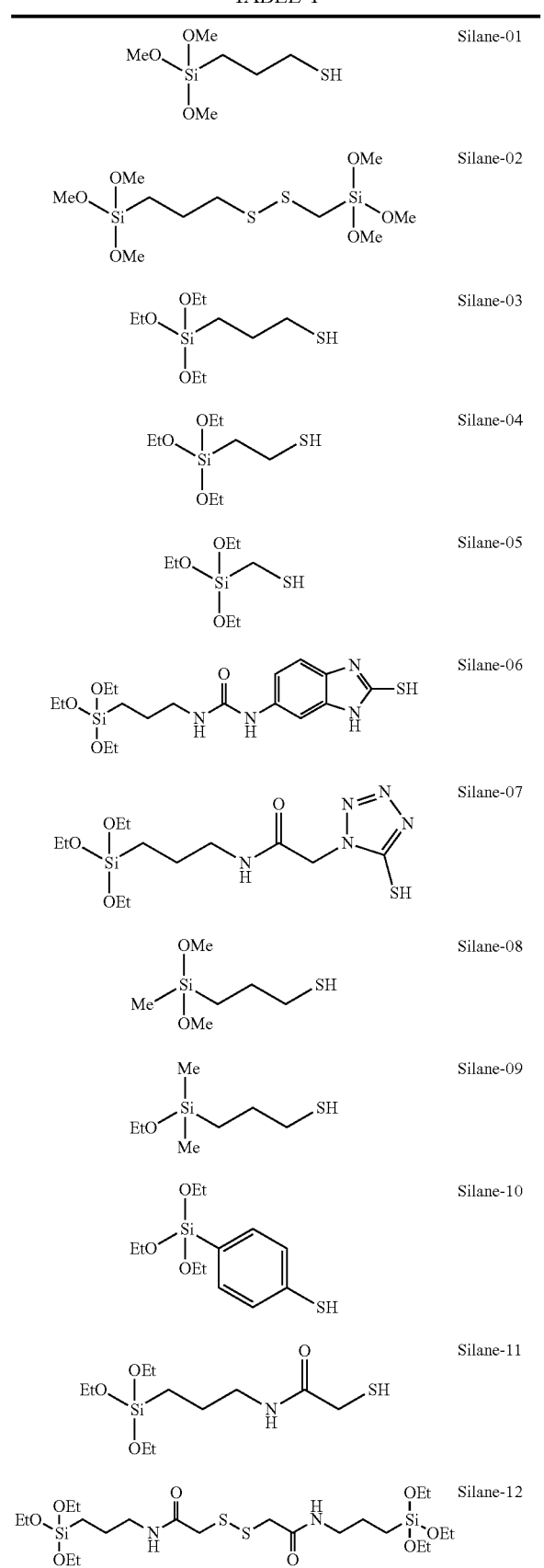

TABLE 1-continued

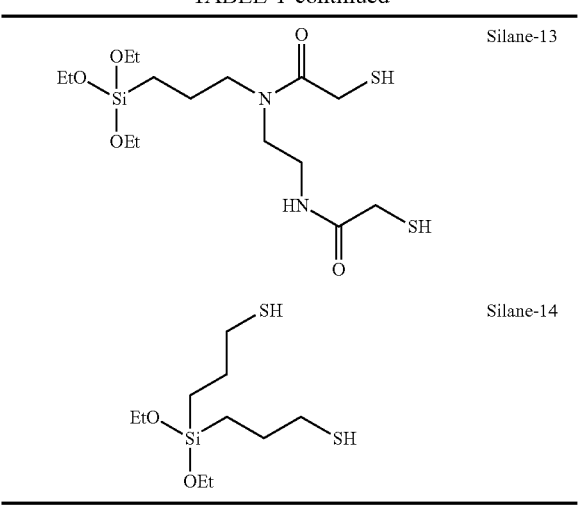

The amount of silane compound, expressed as wt % relative to the total weight of the metallic nanoparticle dispersion, is preferably between 0.005 and 10.0, more preferably between 0.01 and 5.0, most preferably between 0.05 and 2.5.

When the amount is too low the levelling effect may be too low while a too high amount may adversely affect the conductivity of the coating or patterns obtained with the metallic nanoparticle dispersion.

Binder

The metallic nanoparticle dispersion may comprise a binder.

The binder is preferably a polyvinylchloride copolymer. A particular preferred binder is a copolymer of vinyl chloride and a hydroxyfunctional monomer.

The hydroxyl functional monomer is preferably selected from the group consisting of 2-hydroxypropyl acrylate, 1-hydroxy-2-propyl acrylate, 3-methyl-3-buten-1-ol, 2-methyl-2-propenoic acid 2-hydroxypropyl ester, 2-hydroxy-3-chloropropyl methacrylate, N-methylolmethacrylamide, 2-hydroxyethyl methacrylate, poly(ethylene oxide) monomethacrylate, glycerine monomethacrylate, 1,2-propylene glycol methacrylate, 2,3-hydroxypropyl methacrylate, 2-hydroxyethyl acrylate, vinyl alcohol, N-methylolacrylamide, 2-propenoic acid 5-hydroxypentyl ester, 2-methyl-2-propenoic acid, 3-chloro-2-hydroxypropyl ester, 1-hydroxy-2-propenoic acid, 1-methylethyl ester, 2-hydroxyethyl allyl ether, 4-hydroxybutyl acrylate, 1,4-butanediol monovinyl ether, poly(E-caprolactone) hydroxyethyl methacrylate ester, poly(ethylene oxide) monomethacrylate, 2-methyl-2-propenoic acid, 2,5-dihydroxypentyl ester, 2-methyl-2-propenoic acid, 5,6-dihydroxyhexyl ester, 1,6-hexanediol monomethacrylate, 1,4-dideoxy-pentitol, 5-(2-methyl-2-propenoate), 2-propenoic acid, 2,4-dihydroxybutyl ester, 3,4-dihydroxybutyl ester, 2-methyl-2-propenoic acid, 2-hydroxybutyl ester, 3-hydroxypropyl methacrylate, 2,4-dihydroxybutyl ester, isopropenyl alcohol.

The hydroxyl functional monomer is most preferably vinyl alcohol, 2-hydroxypropyl acrylate, 1-hydroxy-2-propyl acrylate, 4-hydroxybutyl acrylate, 2-hydroxyethyl methacrylate, 2-hydroxyethyl acrylate.

Examples of copolymers of vinyl chloride and a hydroxyfunctional monomer are chloroethylene-vinyl acetate-vinyl alcohol copolymer, vinyl alcohol-vinyl chloride copolymer, 2-hydroxypropyl acrylate-vinyl chloride polymer, propanediol monoacrylate-vinyl chloride copolymer, vinyl acetate-vinyl chloride-2-hydroxypropyl acrylate copolymer, hydroxyethyl acrylate-vinyl chloride copolymer, 2-hydroxyethyl methacrylate-vinyl chloride copolymer.

A particular preferred copolymer is a copolymer of vinyl chloride, vinyl acetate and a hydroxyfunctional monomer.

The amount of vinyl chloride is preferably more than or equal to 90 wt % relative to the total weight of the copolymer.

The Molecular Weight (MW) of the copolymer of vinyl chloride and a hydroxyfunctional monomer, measured with Gel Permeation Chromatography (GPC) using polystyrene standards and THE as eluent, is preferably more than or equal to 15 000, more preferably more than or equal to 20 000.

The K value of the copolymer of vinyl chloride and a hydroxyfunctional monomer, measured according to ISO1628-2 (1998) is preferably more than or equal to 40, more preferably more than or equal to 45.

Suitable copolymers are for example Solbin® A, which is a copolymer of 92 wt % vinylchloride-3 wt % vinylacetate-5 wt % vinylalchohol, Solbin® AL, which is a copolymer of 93 wt % vinylchloride-2 wt % vinylacetate-5 wt % vinylalchohol, Solbin® TA2, which is a copolymer of 83 wt % vinylchloride-4 wt % vinylacetate-13 wt % hydroxyalkyl acrylate, Solbin® TA3 which is a copolymer of 83 wt % vinylchloride-4 wt % vinylacetate −13 wt % hydroxyalkylacrylate, Solbin® TAO, which is a copolymer of 91 wt % vinylchloride-2 wt % vinylacetate-7 wt % vinyl alcohol, all commercially available from Shin Etsu; Vinnol® E15/40 A, Vinnol® E 15/45 A, Vinnol® E 15/48 A, Vinnol® E 22/48 A, and Vinnol® H 5/50 A, all commercially available from Wacker Chemie; Sunvac® GH, which is a copolymer of 90 wt % vinylchloride-4 wt % vinylacetate-6 wt % vinyl alcohol, Sunvac® GF, which is a copolymer of 81 wt % vinylchloride-4 wt % vinylacetate-15 wt % hydroxyalkyl acrylate and Sunvac® OH, which is a copolymer of 81 wt % vinylchloride-4 wt % vinylacetate-15 wt % hydroxylalkyl acrylate, all commercially available from Yantai Suny Chem International; S-Lec E4-HA commercailly available from Sekisui; and VROH, LPOH and UMOH commercially available from Wuxi Honghui Chemical.

Another preferred binder is a vinylidene chloride copolymer comprising 90 wt % or less of vinylidene chloride based on the total weight of the binder. When the amount of vinylidene chloride is above 90 wt % based on the total weight of the binder, the crystallinity of the binder becomes too high resulting in a low solubility in the liquid carrier. Copolymerizaton of vinylidene chloride with further monomers renders the copolymer more amorphous and thus more soluble in the liquid carrier.

The vinylidene chloride copolymer preferably comprises a further monomer selected from the group consisting of vinyl chloride, alkyl acrylate, alkyl methacrylate, vinylether, vinylacetate, vinyl alcohol, acrylonitrile, methacrylonitrile, maleic acid, maleic anhydride, itaconic acid, itaconic acid anhydride, and crotonic acid.

Suitable vinylidene chloride copolymers include: the copolymer of vinylidene chloride, N-tert-butylacrylamide, n-butyl acrylate, and N-vinyl pyrrolidone (e.g.70:23:3:4), the copolymer of vinylidene chloride, N-tert-butylacrylamide, n-butyl acrylate, and itaconic acid (e.g. 70:21:5:2), the copolymer of vinylidene chloride, N-tert-butylacrylamide, and itaconic acid (e.g. 88:10:2), the copolymer of vinylidene chloride, n-butylmaleimide, and itaconic acid (e.g. 90:8:2), the copolymer of vinyl chloride, vinylidene chloride, and methacrylic acid (e.g. 65:30:5), the copolymer of vinylidene chloride, vinyl chloride, and itaconic acid (e.g. 70:26:4), the copolymer of vinyl chloride, n-butyl acrylate, and itaconic acid (e.g. 66:30:4), the copolymer of vinylidene chloride, n-butyl acrylate, and itaconic acid (e.g. 80:18:2), the copolymer of vinylidene chloride, methyl acrylate, and itaconic acid (e.g. 90:8:2), the copolymer of vinyl chloride, vinylidene chloride, N-tert-butylacrylamide, and itaconic acid (e.g. 50:30:18:2). All the ratios given between brackets in the above-mentioned copolymers are ratios by weight.

Derivatives of maleic acid or maleic acid anhydride, such as for example the monomers according to Formulae a and b, may also be used as further monomer of the vinylidene chloride copolymer.

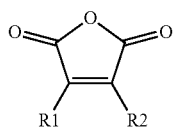

Formula a

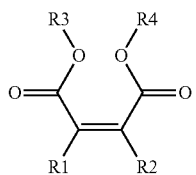

Formula b wherein

R1 to R4 represent a hydrogen atom, an optionally substituted alkyl group containing from 1 to 5 carbon atoms, or an optionally substituted alkenyl group containing from 1 to 5 carbon atoms.

Deriviates of succinic acid or succinic acid anhydride, such as for example the monomers according to Formulae III to VI, may also be used as further monomer of the vinylidene chloride copolymer.

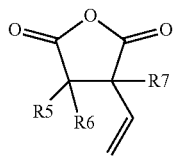

Formula c

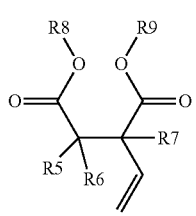

Formula d

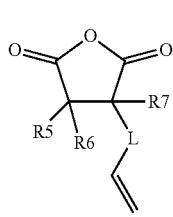

Formula e

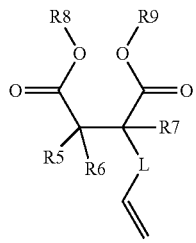

Formula f wherein

R5 to R9 represent a hydrogen atom, an optionally substituted alkyl group containing from 1 to 5 carbon atoms, or an optionally substituted alkenyl group containing from 1 to 5 carbon atoms;

L represents a linking group selected from the group consisting of an alkylene group containing from 1 to 5 carbon atoms, a polyethylene glycol containing up to 5 ethylene glycol units, or a polypropylene glycol containing up to 5 propylene glycol units.

A preferred monomer according to Formula c is 3-ethenyloxolane-2,5-dione; preferred monomers according to Formula d are 2-ethenylbutanedioic acid and 1,4-dimethyl 2-ethenylbutanedioate.

The vinylidene chloride copolymer more preferably comprises a further monomer selected from the group consisting of vinyl chloride, acrylonitrile, maleic acid, maleic anhydride and an alkyl acrylate.

The vinylidene chloride copolymer most preferably comprises from 40 to 90 wt % of vinylidene chloride, from 0.5 to 50 wt % of vinyl chloride and from 0.5 to 5 wt % of acrylonitrile.

The alkyl acrylate and alkyl methacrylate referred to above is preferably a $C_1$-$C_{10}$ alkyl acrylate or methacrylate. Particular preferred alkyl acrylates or alkyl methacrylates are methyl and butyl acrylate or methyl and butyl methacrylate.

A preferred example of a vinylidene chloride copolymer that may be used in the metallic nanoparticle dispersion according to the present invention is IXAN® SGA-1, commercially available from Solvay.

Other vinylidene copolymers that may be used are IXAN® PNE613, IXAN®PV910, IXAN®PV919, IXAN®PVS801, IXAN®PVS815, IXAN®PVS100 or IXAN®PV708, all commercially available from Solvay; F310, F216, R222B or R204, all available from Asahi Kasei Chemicals.

Water based vinylidene copolymers may also be used in the present invention. Examples of such copolymers are Daran® 8730, Daran®8550, Daran®SL112, Daran®SL143, Daran®SL159 or Daran®8100, all commercially available from Owensboro Specialty Polymers; Diofan®193D, Diofan®P520, Diofan®P530 all commercially available from Solvay.

Two or more different binders may be used. For example, the vinylidene chloride copolymer described above may be combined with the vinylchloride copolymer described above.

The total amount of binder in the metallic nanoparticle dispersion is preferably between 0.1 and 15 wt %, more preferably between 0.2 and 7.5 wt %, most preferably between 0.25 and 5 wt %, particularly preferred between 0.5 and 3.0 wt %, relative to the total weight of the dispersion. When the amount of binder is too high, for example above 15 wt % relative to the total weight of the dispersion, the conductivity of the metallic nanoparticle dispersion tends to decrease. When the amount of binder is too low, for example less than 0.1 wt % relative to the total weight of the dispersion, no improvement in adhesion may be observed.

Metallic Nanoparticles

The metallic nanoparticle dispersion of the present invention comprises metallic nanoparticles.

The metallic nanoparticles comprise one or more metals in elemental or alloy form. The metal is preferably selected from the group consisting of silver, gold, copper, nickel, cobalt, molybdenum, palladium, platinum, tin, zinc, titanium, chromium, tantalum, tungsten, iron, rhodium, iridium, ruthenium, osmium, aluminium and lead. Metallic nanoparticles based on silver, copper, molybdenum, aluminium, gold, copper, or a combination thereof, are particularly preferred. Most preferred are metallic nanoparticles based on silver.

The term "nanoparticles" refers to dispersed particles having an average particle size or average particle diameter of less than 150 nm, preferably less than 100 nm, more preferably less than 50 nm, most preferably less than 30 nm. The average particle diameter referred to is determined with Transmission Electron Microscopy (TEM). A metallic nanoparticle dispersion, such as for example a silver ink, may comprise primary particles, and secondary particles. The latter may be aggregated primary particles. The particle diameter referred to above is the particle diameter of the primary particles.

The metallic nanoparticle dispersion preferably comprises at least 5 wt %, more preferably at least 10 wt %, most preferably at least 15 wt %, particularly preferred at least 20 wt % of metallic nanoparticles, relative to the total weight of the dispersion.

Liquid Carrier

The metallic nanoparticle dispersion comprises a liquid carrier.

The liquid carrier is preferably an organic solvent. The organic solvent may be selected from alcohols, aromatic hydrocarbons, ketones, esters, aliphatic hydrocarbons, dimethylsulfoxide (DMSO), higher fatty acids, carbitols, cellosolves, and higher fatty acid esters.

Suitable alcohols include methanol, ethanol, propanol, 1-butanol, 1-pentanol, 2-butanol, t-butanol.

Suitable aromatic hydrocarbons include toluene and xylene.

Suitable ketones include methyl ethyl ketone, methyl isobutyl ketone, 2,4-pentanedione and hexa-fluoroacetone.

Also glycol, glycolethers, N,N-dimethyl-acetamide, N,N-dimethylformamide may be used.

A mixture of organic solvents may be used to optimize the properties of the metallic nanoparticle dispersion.

Preferred organic solvents are high boiling solvents. High boiling organic solvents referred to herein are solvents which have a boiling point that is higher than the boiling point of water (>100° C.)

Preferred high boiling solvents are shown in Table 2.

TABLE 2

| Chemical formula | Chemical name | Bp (° C.) |
|---|---|---|
| | 2-fenoxy ethanol (ethylene glycol monophenylether) | 247 |
| | 4-methyl-1,3-dioxolan-2-one (propylene carbonate) | 242 |
| | n-butanol | 117 |
| | 1,2-propanediol | 211-217 |
| | 4-hydroxy-4-methylpentan-2-one (diacetone alcohol) | 168 |
| | Pentan-3-one (diethyl ketone) | 102 |
| | 2-Butoxyethanol (Ethylene glycol monobutyl ether) | 171 |
| | Dihydrofuran-2(3H)-one (Gamma-butyrolactone) | 204 |
| | 1-methoxy-2-propanol (propylene glycol monomethyl ether) | 120 |
| | Dowanol DPMA (Dipropylene glycol methyl ether acetate) | 209 |
| | dimethylsulfoxide | 189 |
| | Methyl isobutyl ketone | 119 |
| | Propylene glycol mono methyl ether acetate | 146 |

Particularly preferred high boiling solvents used in conductive inkjet inks are 2-phenoxy-ethanol, propylenecarbonate, n-butanol, gamma-butyro-lactone, and mixtures thereof.

Particularly preferred high boiling solvents used in conductive screen printing inks are dimethylsulfoxide, 2-Butoxyethanol, dipropylene glycol methyl ether acetate, and mixtures thereof.

Particularly preferred high boiling solvents used in conductive flexo and gravure printing inks are methyl isobutyl ketone, 2-Butoxy-ethanol, propylene glycol mono methyl ether acetate, and mixtures thereof.

The liquid carrier may also comprise solvents which are used in the preparation method of the nanoparticles, such as those used in the methods disclosed in EP-A 2671927 and EP-A 2781562, for example 2-pyrrolidone.

It has been observed that silver inks wherein the liquid carrier comprises methyl-5-(dimethylamino)-2-methyl-5-oxopentanoate or methylbutyrolactone have improved sticking behavior and improved varnish stability.

The amount of the liquid carrier depends on the desired viscosity of the printing or coating fluid. The amount of the liquid carrier is preferably less than 95 wt %, more preferably less than 90 wt %, most preferably less than 85 wt % relative to the total weight of the metallic nanoparticle dispersion.

Surfactants

The metallic nanoparticle dispersion preferably comprises a surfactant. Various surfactants may be used. However, it has been observed that the addition to the metallic nanoparticle dispersion of a surfactant selected from the group consisting of Disperbyk 2151, Disperbyk 2025, and Diserbyk 2155 results in a further improvement of the adhesion of the dispersion, especially on ITO (Indium Tin Oxide) substrates. Particularly good results are obtained with Disperbyk-2151.

The amount of the surfactants is preferably between 0.01 and 10 wt %, more preferably between 0.05 and 5 wt %, most preferably between 0.1 and 1.0 wt %, relative to the total amount of the metallic nanoparticle dispersion.

Adhesion Promoting Compound

It has been observed that the addition of adhesion promotoring compounds may further improve the adhesion towards various substrates.

For example the commercially available adhesion promoting compound Byk-4511 may improve the adhesion, especially towards ITO (Indium Thin Oxide) substrates.

Particularly preferred adhesion promoting compounds are acidic polyesters. It has been observed that metallic nanoparticle dispersions comprising an acidic polyester are characterized by a substantial improved adhesion on ITO (Indium Thin Oxide) substrates.

The amount of the acidic polyester is preferably between 0.01 and 10 wt %, more preferably between 0.05 and 5 wt %, most preferably between 0.1 and 1.0 wt %, relative to the total amount of the metallic nanoparticle dispersion.

The acidic polyester is typically a copolymer with acidic groups having an acid value from 15 up to 100 mg KOH/g. Examples of commercially available acidic polyesters include BYK-4510 (commercially available from Byk Altana), PLUSOLIT H-PD (commercially available from Mader) or BORCHI GEN HMP-F (commercially available from OMG Borchers).

The acidic polyester is typically a polycondensate of a polyol and a polycarboxylic acid. The polyol and polycarboxylic acid are combined in desired proportions and chemically reacted using standard esterification (condensation) procedures to provide a polyester having both hydroxyl and carboxylic acid groups in the polyester resin. A triol is typically used to provide a branched polyester.

Examples of suitable polycarboxylic acids or anhydrides include, but are not limited to, maleic anhydride, maleic acid, fumaric acid, itaconic acid, phthalic acid, phthalic anhydride, isophthalic acid, trimellitic anhydride, terephthalic acid, naphthalene dicarboxylic acid, adipic acid, azelaic acid, succinic acid, sebacic acid and various mixtures thereof.

Examples of suitable diols, triols and polyols include, but are not limited to, ethylene glycol, propylene glycol, 1,3-propanediol, glycerol, diethylene glycol, dipropylene glycol, triethylene glycol, trimethylolpropane, trimethylolethane, tri propylene glycol, neopentyl glycol, pentaerythritol, 1,4-butanediol, trimethylol propane, hexylene glycol, cyclohexane dimethanol, and polyethylene or polypropylene glycol.

A preferred polyol is trimethylolpropane, a preferred polycarboxylic acid is adipic acid.

Other preferred acidic polyesters are the reaction product of (a) a polyester having a Molecular Weight (Mn) of 2000 to 10 000, a hydroxyl number of 20 to 75, and an acid value of 15 to 25, the polyester being a condensate of:

(i) a polyol component comprising a mixture of diols and triols, (ii) a polyacid component comprising an alpha, beta-ethylenically unsaturated polycarboxylic acid, and (b) a phosphorus acid.

Further examples of phosphatised polyesters are disclosed in WO2012/162301.

Dispersion-Stabilizing Compound (DSC)

The metallic nanoparticle dispersion according to the present invention may comprise a dispersion-stabilizing compound (DSC) according to Formulae VII, VIII, IX or X,

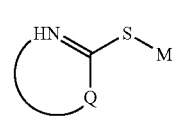

Formula VII

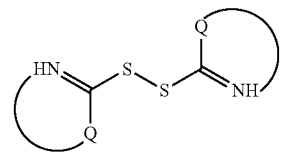

Formula VIII

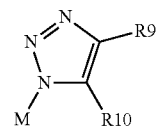

Formula IX

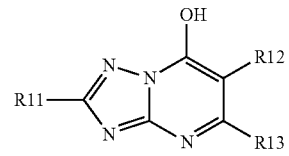

Formula X wherein

Q represents the necessary atoms to form a substituted or unsubstituted five or six membered heteroaromatic ring;

M is selected from the group consisting of a proton, a monovalent cationic group, an alkyl group, a heteroalkyl-group and an acyl group;

R9 and R10 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thioether, an ether, an ester, an amide, an amine, a halogen, a ketone and an aldehyde;

R9 and R10 may represent the necessary atoms to form a five to seven membered ring;

R11 to R13 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, a hydroxyl group, a thiol, a thioether, a sulfone, a sulfoxide, an ether, an ester, an amide, an amine, a halogen, a ketone, an aldehyde, a nitrile and a nitro group;

R12 and R13 may represent the necessary atoms to form a five to seven membered ring.

The dispersion-stabilizing compound is preferably a compound according to Formula VII.

The dispersion-stabilizing compound is more preferably a compound according to Formula VII, wherein Q represents the necessary atoms to form a five membered heteroaromatic ring.

A particular preferred dispersion-stabilizing compound is a compound according Formula VII, wherein Q is a five membered heteroaromatic ring selected from the group consisting of an imidazole, a benzimidazole, a triazole, a benzothiazole, an oxazole, a benzoxazole, a 1,2,3-triazole, a 1,2,4-triazole, an oxadiazole, a thiadiazole and a tetrazole.

Some examples of dispersion-stabilizing compounds are shown in the Table 3.

TABLE 3

| DSC | Chemical Formula |
|---|---|
| DCS-01 | 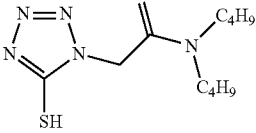 |
| DCS-02 | 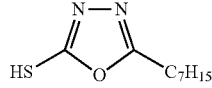 |
| DCS-03 | 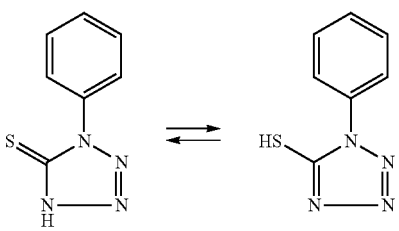 [SMILES: S=c1[nH]nnn1-c1ccccc1 ; Sc1nnnn1-c1ccccc1] |
| DCS-04 | 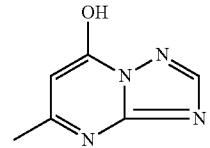 |

TABLE 3-continued

| DSC | Chemical Formula |
|---|---|
| DCS-05 | 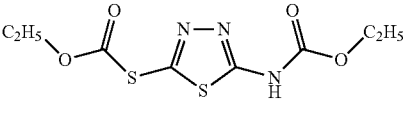 [SMILES: CCOC(=O)Nc1nnc(SC(=O)OCC)s1] |
| DCS-06 | 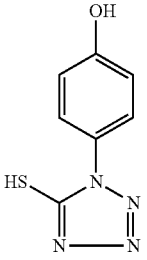 [SMILES: Oc1ccc(-n2nnnc2S)cc1] |
| DCS-07 | 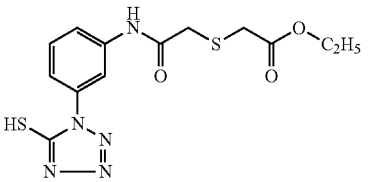 [SMILES: CCOC(=O)CSCC(=O)Nc1cccc(-n2nnnc2S)c1] |
| DCS-08 | 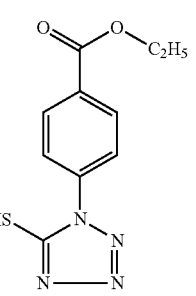 |
| DCS-09 | 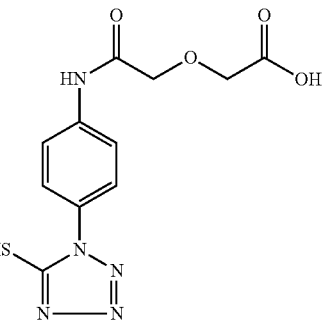 |
| DCS-10 | 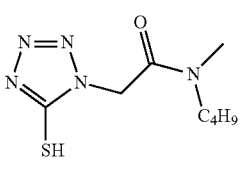 |
| DCS-11 | 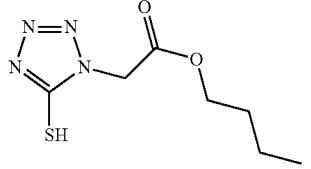 |

TABLE 3-continued

| DSC | Chemical Formula |
| --- | --- |
| DCS-12 | (structure) |
| DCS-13 | (structure) |
| DCS-14 | (structure) |
| DCS-15 | (structure) |
| DCS-16 | (structure) |

The dispersion-stabilizing compound is preferably selected from the group consisting of N, N-dibutyl-(2,5-dihydro-5-thioxo-1H-tetrazol-1-yl-acetamide, 5-heptyl-2-mercapto-1,3,4-oxadiazole, 1 phenyl-5-mercaptotetrazole, 5-methyl-1,2,4-triazolo-(1,5-a) primidine-7-ol, and S-[5-[(ethoxycarbonyl)amino]-1,3,4-thiadiazol-2-yl] O-ethylthiocarbonate.

The dispersion-stabilizing compounds according to Formula VII to X are preferably non-polymeric compounds. Non-polymeric compounds as used herein means compounds having a Molecular Weight which is less preferably than 1000, more preferably less than 500, most preferably less than 350.

The amount of the dispersion-stabilizing compounds (DSC) expressed as wt % relative to the total weight of silver (Ag) in the metallic nanoparticles is preferably between 0.005 and 10.0, more preferably between 0.0075 and 5.0, most preferably between 0.01 and 2.5. When the amount of the dispersion-stabilizing compound relative to the total weight of silver in the metallic nanoparticles is too low, the stabilizing effect may be too low, while a too high amount of the dispersion-stabilizing compound may adversely affect the conductivity of the coating or patterns obtained with the metallic nanoparticle dispersion.

Additives

To optimize the coating or printing properties, and also depending on the application for which it is used, additives such as reducing agents, wetting/levelling agents, dewettting agents, rheology modifiers, adhesion agents, tackifiers, humectants, jetting agents, curing agents, biocides or antioxidants may be added to the metallic nanoparticle dispersion described above.

It may be advantageous to add to the metallic nanoparticle dispersion a small amount of an inorganic acid or a compound capable of generating such an acid during curing of a metallic layer or pattern formed from the metallic nanoparticle dispersion such as disclosed in EP-A 2821164. Higher conductivities and/or lower curing temperatures were observed of layers or patterns formed from such metallic nanoparticle dispersions.

Higher conductivities and/or lower curing temperatures may also be obtained when using metallic nanoparticles dispersions containing a compound according to Formula XI, as disclosed in WO2015/000937.

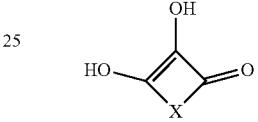

Formula XI wherein

X represents the necessary atoms to form a a substituted or unsubstituted ring.

A particularly preferred compound according to Formula XI is an ascorbic or erythorbic acid derivative compound.

A thickening agent may be added to increase the viscosity of the printing or coating fluid. Preferred thickening agents may be selected from amorphous silica, polyvinylpyrrolidones having different Molecular Weights, and cellulose based thickening agents. A particular preferred thickening agent is hydroxypropylcellulose.

Preparation of the Metallic Nanoparticle Dispersion

The preparation of the metallic nanoparticle dispersion according to the present invention typically comprises the addition of the liquid carrier, the silane compound, the optional binder and optional additives to the metallic nanoparticles by using a homogenization technique such as stirring, high shear mixing, ultra-sonication, or a combination thereof.

The metallic nanoparticles from which the metallic nanoparticle dispersion is made is typically a paste or a highly concentrated dispersion of metallic nanoparticles. A preferred preparation method of the metallic nanoparticles is described below.

The homogenization step can be carried out at elevated temperature up to 100° C. In a preferred embodiment, the homogenization step is carried out at temperature equal or below 60° C.

In a preferred embodiment, the metallic nanoparticle dispersion is used in an inkjet printing method. Such a metallic nanoparticle dispersion, also referred to as metallic inkjet fluid or ink or conductive inkjet fluid or ink, preferably has a viscosity lower than 35 mPa·s, preferably lower than 28 mPa·s, and most preferably between 2 and 25 mPa·s at 25° C. and measured at a shear rate of 90 s$^{-1}$.

When using so-called throughflow printheads, the viscosity of the metallic inkjet fluid may be higher, preferably below 60 mPa·s at 25° C. and at a shear rate of 90 s$^{-1}$. A higher viscosity limit for the metallic inkjet fluid opens up more compositional variations of the fluid which may be advantageous towards more concentrated and/or more stable metallic inkjet fluids.

In another preferred embodiment, the metallic nanoparticle dispersion is used in a flexographic printing process. Such a metallic nanoparticle dispersion, also referred to as metallic flexo ink or conductive flexo ink, preferably has a viscosity between 10 and 200 mPa·s, more preferably between 25 and 150 mPa·s, most preferably between 50 and 100 mPa·s measured at 25° C. and at a shear rate of 90 s$^{-1}$.

In another preferred embodiment, the metallic nanoparticle dispersion is used in a screen printing process. Such a metallic nanoparticle dispersion, also referred to as metallic screen ink or conductive screen ink, preferably has a viscosity between 3000 and 1000000 mPa·s, most preferably between 5000 and 750000 mPa·s, most preferably between 10000 and 500000, measured at 25° C. and at a shear rate of 1 s$^{-1}$.

Metallic Layers or Patterns

Thin layers or patterns printed or coated from the metallic nanoparticle dispersion can be rendered conductive at lower sintering temperatures compared to those obtained with conventional metallic printing or coating fluids. Therefore, conductive thin layers or patterns made from the metallic printing or coating fluids of the present invention can be coated or printed on flexible supports that can not withstand thermal treatment at high temperature, such as for example PET.

The metallic layers or patterns are prepared by a method comprising the steps of applying a metallic nanoparticle dispersion as defined above on a support followed by a sintering step.

The support may a glass, a paper or a polymeric support.

Preferred polymeric supports are polycarbonate, polyethylene terephthalate (PET) or polyvinylchloride (PVC) based supports. A preferred PET support is for example an AUTOSTAT™ heat stabilized polyester from MacDermid.

The above mentioned supports may be provided with one or more layers to improve the adhesion, absorption or spreading of the applied conductive inkjet, screen or flexo inks.

Polymeric supports are preferably provided with so-called subbing layers to improve the adhesion of the applied conductive inkjet, screen or flexo inks. Such subbing layers are typically based on vinylidene copolymers, polyesters, or (meth)acrylates.

Useful subbing layers for this purpose are well known in the art and include, for example, polymers of vinylidene chloride such as vinylidene chloride/acrylonitrile/acrylic acid terpolymers or vinylidene chloride/methyl acrylate/ itaconic acid terpolymers.

Other preferred subbing layers include a binder based on a polyester-urethane copolymer. In a more preferred embodiment, the polyester-urethane copolymer is an ionomer type polyester urethane, preferably using polyester segments based on terephthalic acid and ethylene glycol and hexamethylene diisocyanate. A suitable polyester-urethane copolymer is Hydran™ APX101 H from DIC Europe GmbH.

The application of subbing layers is well-known in the art of manufacturing polyester supports for silver halide photographic films. For example, the preparation of such subbing layers is disclosed in U.S. Pat. No. 3,649,336 and GB 1441591.

An acid generating compound may be incorporated in a primer layer on a support as disclosed in WO2015/000932.

A preferred primer comprises a copolymer of vinylidene chloride, an acrylic ester and itaconic acid.

In a preferred embodiment, the subbing layer has a dry thickness of no more than 0.2 μm or preferably no more than 200 mg/m$^2$.

Another preferred support is a support based on transparent conductive oxides. Such a support is typically a glass or polymer support whereupon a layer or pattern of a transparent conductive oxide (TCO) is provided. Examples of such conductive oxides are ITO (Indium Tin Oxide), ZnO, SnO$_2$ or doped oxides such as ZnO:Al. A particularly preferred TCO is ITO.

A preferred paper based support is the Powercoat® paper substrate, a substrate designed for printed electronics by Arjowiggins Creative Papers.

Multiple metallic layers or patterns, i.e. a stack of patterned or unpatterned layers, may be applied on a substrate. The support referred to in the method of preparing the metallic layers or patterns thus also encompass a previously applied metallic layer or pattern.

Metallic layers may be provided onto a support by co-extrusion or any conventional coating technique, such as dip coating, knife coating, extrusion coating, spin coating, spray coating, blade coating, slot die coating, slide hopper coating and curtain coating.

Metallic layers and in particular metallic patterns may be provided onto a support by a printing method such as intaglio printing, screen printing, flexographic printing, offset printing, inkjet printing, gravure offset printing, etc.

Preferred printing methods are an inkjet, screen printing and flexographic printing method.

Another method to provide a metallic layer or pattern on a support is aerosol jet printing. Aerosol Jet Printing, which has been developed by Optomec, preserves most of the advantages of inkjet printing, while reducing many of its limitations. The technique is developed for use in the field of printed electronics. The technique is disclosed in for example US2003/0048314, US2003/0020768, US2003/0228124 and WO2009/049072. An Aerosol Jet Print Engine is commercially available from Optomec, for example the Aerosol Jet Printer OPTOMEC AJ 300 CE.

Virtually any liquid having a viscosity less than 5000 mPa·s can be deposited using the Aerosol Jet Printing technique. Using higher viscous fluids may be advantageous with respect to the stability of the metallic inks.

Curing Step

After the layers or patterns are applied on the support, a sintering step, also referred to as curing step, is carried out. During this sintering step, solvents evaporate and the metallic particles sinter together. Once a continuous percolating network is formed between the metallic particles, the layers or patterns become conductive. Conventional sintering is typically carried out by applying heat. The sintering temperature and time are dependent on the support used and on the composition of the metallic layer or pattern. The sintering step for curing the metallic layers may be performed at a temperature below 250° C., preferably below 200° C., more preferably below 180° C., most preferably below 160° C.

The sintering time may be less than 60 minutes, preferably between 2 and 30 minutes and more preferably between 3 and 20 minutes, depending on the selected temperature, support and composition of the metallic layers.

However, instead of or in addition to the conventional sintering by applying heat, alternative sintering methods such as exposure to an Argon laser, to microwave radiation, to IR radiation, to UV radiation or to low pressure Argon plasma, photonic curing, plasma or plasma enhanced, electron beam, laser beam or pulse electric current sintering may be used. When using pulse electric current sintering, the electric current may be directly applied to the conductive ink or indirectly via induction.

Another curing method uses the so-called Near InfraRed (NIR) curing technology. The metal of the coating or the pattern, for example silver, may act as absorber for the NIR radiation.

Still another curing method uses heated steam instead of hot air temperature curing which also efficiently heats up and sinters the metal of the coating or the pattern.

The metallic layers of the present invention allow to use lower curing temperatures than the prior art processes. In consequence it is possible to use polymeric substrates that can not withstand thermal treatment at high temperature, such as for example PET. The curing time may also be substantially reduced leading to the possibility of having higher production per hour than the prior art processes. The conductivity of the metallic layers are maintained or even improved in certain cases.

To further increase the conductivity or to lower the curing temperature it may be advantageous to contact the metallic layer or pattern with a solution containing an acid or an acid precursor capable or releasing the acid during curing of the metallic layer or pattern, as disclosed in WO2015/000932.

The metallic layers or patterns may be used in various electronic devices or parts of such electronic devices as for example organic photo-voltaics (OPV's), inorganic photo-voltaics (c-Si, a-Si, CdTe, CIGS), OLED displays, OLED lighting, inorganic lighting, RFID's, organic transistors, thin film batteries, touch-screens, e-paper, LCD's, plasma, sensors, membrane switches or electromagnetic shielding.

Preparation of the Metallic Nanoparticles

The metallic nanoparticle according to the present invention may be prepared by any known preparation method.

A particularly preferred method to prepare the metallic nanoparticles is disclosed in EP-A 2781562.

The metallic nanoparticle dispersion obtained by the method disclosed in EP-A 2781562 typically contains at least 15 wt %, more preferably at least 30 wt %, most preferably at least 50 wt % of metallic nanoparticles, relative to the total weight of the dispersion. This highly concentrated dispersion is then used to prepare the metallic nanoparticle dispersion according to the present invention as described above.

EXAMPLES

Materials

All materials used in the following examples were readily available from standard sources such as ALDRICH CHEMICAL Co. (Belgium) and ACROS (Belgium) unless otherwise specified. The water used was deionized water.

Silver oxide ($Ag_2O$) was prepared by the precipitation of silver nitrate in an alkaline aqueous solution of sodium hydroxide (33 wt %) followed by filtration and drying.

Solbin® A is a copolymer of 92 wt % vinylchloride, 3 wt % vinylacetate, and 5 wt % vinylalchohol commercially available from SHIN ETSU.

Butyl Cellosolve (CASRN 111-76-2) is ethylene glycol monobutylether commerically available from MERCK.

Efka FL3277 (CASRN 849624-75-5) is a wetting agent commercially available from BASF.

Disperbyk 2151 is a wetting agent commercially available from BYK (ALTANA).

Byk 4510 is an adhesion promoting compound commercially available from BYK (ALTANA).

Rhodiasolv® PolarClean is 5-(dimethylamino) 2-methyl 5-oxopentanoate commercially available from SOLVAY.

Silane-01 is 3-mercaptopropyl trimethoxy silane commercially available from ALDRICH CHEMICAL Co.

PET is a polyethyleneterephtalate support (163 μm) from AGFA GEVAERT.

Subbed PET is PET having on both sides a primer. The primer, coated from an aqueous coating solution, has a composition according to the following Table 4.

TABLE 4

| Ingredients | Amount (mg/m$^2$) |
|---|---|
| Copol (ViC12-MA-IA) | 151.00 |
| Kieselsol 100 F | 35.00 |
| Mersolat H40 | 0.75 |

Copol ($ViCl_2$-MA-IA) is a copolymer of vinylidenechloride-methacrylic acid and itaconic acid from AGFA GEVAERT.

Mersolat H40 is a surfactant from LANXESS.

Kieselsol 100F is a silica from BAYER.

Autostat CT7 is a 175 μm heat stabilized polyester support from MACDERMID.

Polycarbonate is a 250 μm polycarbonate sheet (Lexan 8A73) available from TEKRA.

Geniosil GF96 is 3-aminopropyltrimethoxysilane commercially available from WACKER.

Silquest A-1524 is a gamma-ureido-propyltrimethoxysilane commercially available from MOMENTIVE.

Dynasylan Glymo is 3-glycidyloxypropyltrimethoxysilane commercially available from EVONIK.

Geniosil GF9 is N-(2-aminoethyl)-3-aminopropyltrimethoxysilane commercially available from WACKER.

Measurements Methods

Screen Printing

Screen printing of silver inks was performed using a P180-27 polymer screen mesh (available from PUBLIVENOR) and a Capillex CP stencil film (available from MACDERMID AUTOTYPE) on a Rokuprint SD2.1 screen printing equipment.

Screen mesh tension was 27 N/cm, print speed 300 mm/s. A Unitex 80° Sh A squeegee was used with an angle of 75° with reference to the screen mesh. A metallic flood bar was used with an angle of 90° and distance of approximately 175 μm with reference to the screen mesh. The distance of the screen mesh to the substrate was 2.5 mm. The squeegee pressure was minimized to a minimum level where ink is still adequately printed on the substrate.

A pattern with a dimension of approximately 6.0×4.5 cm was printed.

Conductivity of the Silver Coatings

The surface resistance (SER) of the silver coatings was measured using a four-point collinear probe. The surface or sheet resistance was calculated by the following formula:

$$SER = (\pi/\ln 2) * (V/I)$$

wherein

SER is the surface resistance of the layer expressed in Ω/square;

π is a mathematical constant, approximately equal to 3.14;

ln 2 is a mathematical constant equal to the natural logarithmic of value 2, approximately equal to 0.693;

V is voltage measured by voltmeter of the four-point probe measurement device;

I is the source current measured by the four-point probe measurement device.

For each sample, six measurements were performed at different positions of the coating and the average value was calculated.

The silver content $M_{Ag}$ (g/m$^2$) of the coatings was determined by WD-XRF.

The conductivity of the coated layers was then determined by calculating the conductivity as a percentage of the bulk conductivity of silver using the following formula:

$$\% Ag_{(bulk)} = \frac{\sigma_{Coat}}{\sigma_{Ag}} \times 100$$

$$\% Ag_{(bulk)} = \frac{\rho_{Ag}}{\sigma_{Ag} \times SER \times M_{Ag}} \times 100$$

wherein $\sigma_{Ag}$ the specific conductivity of silver (equal to 6.3×10$^7$ S/m), $\sigma_{Coat}$ is the specific conductivity of the Ag coating and $\rho_{Ag}$ is the density of silver (1.049×10$^7$ g/m$^3$).

Adhesion

The adhesion of the silver coatings on different substrates has been evaluated by a tape test according to ASTM D3359. The evaluation results in a score from 0 (very good adhesion) to 5 (very bad adhesion).

Dynamic Viscosity

Dynamic viscosities were measured with a HAAKE™ RotoVisco™ Rotational Reometer, commercially available from Thermo Fisher Scientific at 25° C.

Transparency

The transparency of a screen printed image, i.e. the occurrence of pinholes or transparent regions between printed dots, was visually evaluated using a scale from 0 to 5 wherein 0 is very good, i.e. very little transparency, and 5 is very bad, i.e. a substantial amount of transparent regions in the printed image.

Example 1

Preparation of the Silver Nanoparticle Dispersion NPD-01

78.0 g of silver oxide was slowly added, while stirring, to a 1 l reactor containing 275.0 g of pentanoic acid and 401.0 g of 2-pyrrolidone. The temperature of the mixture was kept at 25° C.

After complete addition of the silver oxide, the suspension was stirred overnight at 25° C.

Then, 300.0 g of N,N-diethylhydroxylamine was added in a time span of 1.5 hours to the suspension. The temperature of the reaction mixture was kept at 25° C. When all reducing agent was added, the reaction mixture was kept at 25° C. while stirring for another hour.

The reaction mixture is then fed to a sedimentation vessel, where it was kept overnight, without stirring. The supernatant was carefully removed from the sediment.

The obtained sediment was washed four times, two times with Dowanol PM™ (547 g) and two times with Butylcellosolve™ (547 g). In each washing step, the solvent was added to the sediment and the resulting suspension stirred for 0.5 hour at 300 rpm. Then, the unstirred suspension was kept for another hour, and the supernatant carefully removed.

After the last washing step with Butylcellosolve™, the sediment was centrifuged, in a centrifugal decanter from Rousselet Robatel (France) at 3000 rpm during 0.5 hour.

The obtained silver nanoparticle dispersion NPD-01 had ±75 wt % of silver, relative to the total weight of the dispersion.

Preparation of the Silver Inks SI-01 to SI-05

The Silver Inks SI-01 to SI-05 were prepared by mixing together while stirring the non-silver ingredients of Table 5 until a clear solution was obtained. The silver nanoparticle dispersion NPD-01 was then added to the clear solution, followed by high shear homogenization.

TABLE 5

| Ingredient (wt %) | COMP-01 | INV-01 | INV-02 | INV-03 | INV-04 |
|---|---|---|---|---|---|
| Solbin A | 2.55 | = | = | = | = |
| Rhodiasolv Polarclean | 9.00 | = | = | = | = |
| Byk-4510 | 0.24 | = | = | — | — |
| Silane-01 | — | 0.12 | 0.24 | 0.12 | 0.24 |
| Disperbyk 2151 | 0.83 | = | = | = | = |
| Efka FL3277 | 0.38 | = | = | = | = |
| Butylcellosolve | 1.7 | = | = | = | = |
| NPD-01 | 76.9 | = | = | = | = |

Evaluation of the Silver Inks SI-01 to Si-05

The dynamic viscosities of the silver inks SI-01 to SI-05 measured as described above are given in Table 6.

TABLE 6

| Visco (mPa · s) | 1/s | 10/s | 100/s | 400/s | 700/s | 1000/s | Flooding |
|---|---|---|---|---|---|---|---|
| SI-01 (COMP) | >200000 | 43340 | 4712 | 1665 | 1165 | 841 | difficult |
| SI-02 (INV) | 187100 | 23690 | 3275 | 1306 | 944 | 778 | moderate |
| SI-03 (INV) | 131900 | 15200 | 2265 | 990 | 743 | 625 | good |
| SI-04 (INV) | 78180 | 33280 | 4821 | 1636 | 1085 | . . . | moderate |
| SI-05 (INV) | 147600 | 17720 | 2792 | 1169 | 862 | 708 | good |

From the results in Table 6 it is clear that the viscosities at low sheer rate (1/s and 10/s) of the inventive silver inks are lower than those of the comparative example, while the viscosities at high shear remain acceptable for obtaining a good print quality. Lower viscosities at low shear result in an improved flooding of the screen, i.e. spreading of the ink across the screen.

After screen printing the silver inks on several substrates and curing the printed silver image at 150° C. during 15 minutes, the adhesion, the conductivity and the transparency have been evaluated as described above. The results are given in respectively Tables 7, 8 and 9.

TABLE 7

| Conductivity (% bulk) | Autostat CT7 | Subbed PET | PET | Polycarbonate |
|---|---|---|---|---|
| SI-01 (COMP) | 42 | 42 | 47 | 32 |
| SI-02 (INV) | 41 | 33 | 40 | 25 |
| SI-03 (INV) | 39 | 27 | 24 | 29 |
| SI-04 (INV) | 39 | 31 | 38 | 29 |
| SI-05 (INV) | 26 | 28 | 36 | 29 |

The conductivity of the inventive silver inks containing a silane compound according to the present invention remains acceptable on all supports. Increasing the amount of the silane compound tends to decrease the conductivity.

TABLE 8

| Adhesion [0-5] | Autostat CT7 | Subbed PET | PET | Polycarbonate |
|---|---|---|---|---|
| SI-01 (COMP) | 0 | 0 | 0 | 0 |
| SI-02 (INV) | 0 | 0 | 0 | 0 |
| SI-03 (INV) | 0 | 0 | 0 | 0 |
| SI-04 (INV) | 0 | 0 | 0 | 0 |
| SI-05 (INV) | 0 | 0 | 0 | 0 |

The adhesion of the silver inks SI-01 to SI-05 was good on all substrates.

TABLE 9

| Transparency [0-5] | Autostat CT7 | Subbed PET | PET | Polycarbonate |
|---|---|---|---|---|
| SI-01 (COMP) | 0 | 0 | 1 | 3 |
| SI-02 (INV) | 0 | 0 | 0 | 2 |
| SI-03 (INV) | 0 | 0 | 0 | 0 |
| SI-04 (INV) | 0 | 0 | 0 | 2 |
| SI-05 (INV) | 0 | 0 | 0 | 0 |

The transparency of the printed inventive silver inks is better on PET and polycarbonate. On polycarbonate it is clear that the best transparency is observed with the silver inks containing the highest amount of the silane compound.

Example 2

Preparation of the Silver Inks SI-06 to SI-11

The Silver Inks SI-06 to SI-11 were prepared by mixing together while stirring the non-silver ingredients of Table 10 until a clear solution was obtained. The silver nanoparticle dispersion NPD-01 was then added to the clear solution, followed by high shear homogenization.

TABLE 10

| Ingredient (wt %) | SI-06 | SI-07 | SI-08 | SI-09 | SI-10 | SI-11 |
|---|---|---|---|---|---|---|
| Solbin A | 2.58 | 2.57 | = | = | = | = |
| Rhodiasolv Polarclean | 9.09 | = | = | = | = | = |
| Byk-4510 | 0.24 | = | = | = | = | = |
| Geniosil GF96 | — | 0.30 | — | — | — | — |
| Silquest A-1524 | — | — | 0.30 | — | — | — |
| Silane-01 | — | — | — | 0.30 | — | — |
| Dynasylan Glymo | — | — | — | — | 0.30 | — |
| Geniosil GF9 | — | — | — | — | — | 0.30 |
| Disperbyk 2151 | 0.84 | 0.83 | = | = | = | = |
| Efka FL3277 | 0.38 | = | = | = | = | = |
| Butylcellosolve | 1.7 | = | = | = | = | = |
| NPD-01 | 77.2 | = | = | = | = | = |

Evaluation of the Silver Inks SI-06 to Si-011

The dynamic viscosities of the silver inks SI-06 to SI-11 measured as described above are given in Table 11.

TABLE 11

| Visco (mPa·s) | 1/s | 10/s | 100/s | 400/s | 700/s | 1000/s | Flooding |
|---|---|---|---|---|---|---|---|
| SI-06 (COMP) | 148700 | 22710 | 3234 | 1342 | 985 | 803 | moderate |
| SI-07 (COMP) | 148200 | 19100 | 2650 | 1146 | 876 | 744 | moderate |
| SI-08 (COMP) | 143500 | 22050 | 2997 | 1259 | 945 | 791 | moderate |
| SI-09 (INV) | 21280 | 3796 | 1216 | 777 | 671 | 598 | excellent |
| SI-10 (COMP) | 144400 | 21780 | 2896 | 1200 | 899 | 753 | moderate |
| SI-11 (COMP) | 108300 | 11800 | 2004 | 995 | 794 | 687 | moderate |

From the results in Table 11 it is clear that the viscosities at low shear (1/s and 10/s) of the inventive silver ink SI-09 is lower than those of the comparative example while the viscosities at high shear remain acceptable for obtaining a good print quality. Lower viscosities at low shear results in an improved flooding of the screen, i.e. spreading of the ink across the screen.

After screen printing the silver inks on several substrates and curing the printed silver image at 150° C. during 15 minutes, the adhesion, the conductivity and the transparency have been evaluated as described above. The results are given in respectively Tables 12, 13 and 14.

TABLE 12

| Conductivity (% bulk) | Autostat CT7 | Subbed PET | PET | Polycarbonate |
|---|---|---|---|---|
| SI-06 (COMP) | 48 | 43 | 52 | 34 |
| SI-07 (COMP) | 33 | 31 | 32 | 21 |
| SI-08 (COMP) | 42 | 42 | 32 | 33 |
| SI-09 (INV) | 28 | 26 | 15 | 25 |
| SI-10 (COMP) | 38 | 42 | 47 | 26 |
| SI-11 (COMP) | 30 | 29 | 26 | 16 |

The conductivity of the inventive silver inks containing a silane compound according to the present invention remains acceptable on all supports.

TABLE 13

| Adhesion [0-5] | Autostat CT7 | Subbed PET | PET | Polycarbonate |
|---|---|---|---|---|
| SI-06 (COMP) | 0 | 0 | 0 | 0 |
| SI-07 (COMP) | 0 | 0 | 0 | 0 |
| SI-08 (COMP) | 0 | 0 | 0 | 0 |
| SI-09 (INV) | 0 | 0 | 0 | 0 |
| SI-10 (COMP) | 0 | 0 | 0 | 0 |
| SI-11 (COMP) | 0 | 0 | 0 | 0 |

The adhesion of the silver inks SI-06 to SI-11 is good on all substrates.

TABLE 14

| Transparency [0-5] | Autostat CT7 | Subbed PET | PET | Polycarbonate |
|---|---|---|---|---|
| SI-06 (COMP) | 0 | 0 | 0 | 3 |
| SI-07 (COMP) | 0 | 0 | 0 | 3 |
| SI-08 (COMP) | 0 | 0 | 0 | 3 |
| SI-09 (INV) | 0 | 0 | 0 | 0 |
| SI-10 (COMP) | 0 | 0 | 0 | 3 |
| SI-11 (COMP) | 0 | 0 | 0 | 3 |

The transparency of the printed inventive silver inks is better on polycarbonate.

The invention claimed is:

1. A metallic nanoparticle dispersion comprising:
    metallic nanoparticles;
    a liquid carrier; and
    a silane compound according to Formula I:

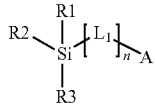

Formula I wherein
    R1, R2, and R3 are independently selected from the group consisting of a hydrogen, a substituted or unsubstituted alkyl group, a substituted or unsubstituted aryl group, an alkoxy group, and an aryloxy group in which at least one of R1 to R3 represents an alkoxy group or an aryloxy group;
    $L_1$ represents a divalent linking group including 1 to 20 carbon atoms;
    A represents a thiol, a disulfide, or a functional moiety including at least one thiol or disulfide, and having no more than 10 carbon atoms; and
    n represents 0 or 1,
    wherein the metallic nanoparticles are silver nanoparticles and have a silane compound to silver ratio of about 0.001 to about 0.005 based on the weight percent of silane compound and silver.

2. The metallic nanoparticle dispersion according to claim 1, wherein the silane compound is represented by Formula II:

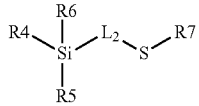

Formula II wherein
    R4, R5, and R6 are independently selected from the group consisting of a hydrogen, a substituted or unsubstituted alkyl group, a substituted or unsubstituted aryl group, an alkoxy group, and an aryloxy group in which at least one of R4 to R6 represents an alkoxy group or an aryloxy group;
    $L_2$ represents an aliphatic divalent linking group including 1 to 10 carbon atoms, optionally substituted in the aliphatic chain with one or more oxygen or nitrogen atoms;
    R7 is hydrogen or S-R8;
    R8 is selected from the group consisting of a substituted or unsubstituted alkyl group, a substituted or unsubstituted alkenyl group, a substituted or unsubstituted alkynyl group, a substituted or unsubstituted aralkyl group, a substituted or unsubstituted alkaryl group, and a substituted or unsubstituted aryl or heteroaryl group.

3. The metallic nanoparticle dispersion according to claim 1, wherein the silane compound is represented by Formula III:

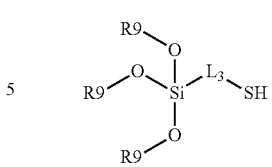

Formula III wherein
    R9 represents a substituted or unsubstituted alkyl group; and
    $L_3$ represents an aliphatic linking group including 1 to 5 carbon atoms.

4. The metallic nanoparticle dispersion according to claim 1, wherein an amount of the silane compound is between 0.005 and 10 wt % relative to a total weight of the metallic nanoparticle dispersion.

5. The metallic nanoparticle dispersion according to claim 1, further comprising a binder including a polyvinylchloride copolymer.

6. The metallic nanoparticle dispersion according to claim 5, wherein the polyvinylchloride copolymer includes a copolymer of vinyl chloride and a hydroxyfunctional monomer.

7. The metallic nanoparticle dispersion according to claim 5, wherein an amount of the binder is from 0.25 to 5.0 wt % relative to a total weight of the metallic nanoparticle dispersion.

8. The metallic nanoparticle dispersion according to claim 1, further comprising an adhesion promoting compound including an acidic polyester.

9. The metallic nanoparticle dispersion according to claim 8, wherein an amount of the acidic polyester is between 0.01 and 10.0 wt % relative to a total weight of the metallic nanoparticle dispersion.

10. The metallic nanoparticle dispersion according to claim 1, wherein the liquid carrier includes a solvent selected from the group consisting of 2-phenoxy-ethanol, propylene-carbonate, n-butanol, gamma-butyro-lactone, dimethylsulphoxide, 2-butoxyethanol, dipropylene glycol methyl ether acetate, methyl isobutyl ketone, propylene glycol mono methyl ether acetate, methyl butyro-lactone, and 5-dimethyl-amino-2-methyl-5-oxopentanoate.

11. A method of preparing a metallic layer or pattern comprising:
    providing a substrate;
    applying the metallic nanoparticle dispersion as defined in claim 1 onto the substrate; and
    sintering the metallic nanoparticle dispersion applied onto the substrate to form the metallic layer or the pattern.

12. The method according to claim 11, wherein the substrate includes a paper substrate, a glass substrate, a polymeric substrate with or without a primer layer, or an ITO layer on a polymeric support or a glass support.

13. The method according to claim 11, wherein the step of applying the metallic nanoparticle dispersion includes a printing method selected from intaglio printing, screen printing, flexographic printing, offset printing, inkjet printing, or gravure offset printing.

14. The method according to claim 11, wherein the step of sintering is performed at a temperature of 200° C. or less for 30 minutes or less.

15. The method according to claim 11, wherein the step of sintering is performed by exposing the metallic layer or the pattern to Near Infrared Radiation.

* * * * *